United States Patent
Matumoto et al.

(10) Patent No.: US 6,887,096 B2
(45) Date of Patent: May 3, 2005

(54) CONNECTOR, ELECTRONIC EQUIPMENT AND CONTROL METHOD FOR ELECTRONIC EQUIPMENT

(75) Inventors: Isao Matumoto, Saitama (JP); Hironori Kobayashi, Saitama (JP); Norifumi Nishida, Saitama (JP); Makoto Fukuya, Saitama (JP)

(73) Assignee: Pioneer Corporation, Tokyo (JP)

( * ) Notice: Subject to any disclaimer, the term of this patent is extended or adjusted under 35 U.S.C. 154(b) by 114 days.

(21) Appl. No.: 10/315,062

(22) Filed: Dec. 10, 2002

(65) Prior Publication Data

US 2003/0114033 A1 Jun. 19, 2003

(30) Foreign Application Priority Data

Dec. 17, 2001 (JP) .................................... P2001-382694

(51) Int. Cl.[7] ................................................ H01R 3/00
(52) U.S. Cl. .................................... 439/489; 439/924.1
(58) Field of Search ............................ 439/489, 924.1, 439/374, 626; 345/211–212

(56) References Cited

U.S. PATENT DOCUMENTS

| | | | | |
|---|---|---|---|---|
| 3,993,935 A | * | 11/1976 | Phillips et al. ............... | 361/748 |
| 4,801,924 A | * | 1/1989 | Burgmann et al. .......... | 340/521 |
| 4,993,972 A | * | 2/1991 | Lin ............................. | 439/637 |
| 5,010,437 A | * | 4/1991 | Utsugi et al. ................ | 360/137 |
| 5,174,787 A | * | 12/1992 | Shirai et al. ................. | 439/489 |
| 5,177,730 A | * | 1/1993 | Utsugi ........................ | 369/75.1 |
| 5,179,492 A | | 1/1993 | Kato et al. | |
| 5,255,162 A | * | 10/1993 | Kawamoto ................... | 362/26 |
| 5,363,122 A | * | 11/1994 | Suenaga et al. ............. | 345/212 |
| 5,904,597 A | * | 5/1999 | Doi et al. .................... | 439/660 |
| 6,113,396 A | | 9/2000 | Tung | |
| 6,146,175 A | * | 11/2000 | Shibata ........................ | 439/284 |
| 6,663,439 B2 | * | 12/2003 | Henry et al. ................. | 439/700 |

FOREIGN PATENT DOCUMENTS

| | | |
|---|---|---|
| DE | 4008536 A1 | 10/1990 |
| EP | 0 755 101 A2 | 1/1997 |
| FR | 2 408 905 | 6/1979 |

\* cited by examiner

Primary Examiner—Hae M Hyeon
(74) Attorney, Agent, or Firm—Sughrue Mion, PLLC

(57) ABSTRACT

A connector has an operation unit connector that is fixed on an operation unit, and an electronic equipment main body connector that is fixed on an electronic equipment main body. The operation unit connector has plural terminals at regular intervals aligned in a row. The electronic equipment main body connector has plural electrodes at positions corresponding to the terminals at regular intervals. At least one of the electrodes is formed to be shorter than other electrodes and serves as a detecting electrode. The detecting electrode is disposed at the same upper position as the other electrodes, and shorter on the lower side.

16 Claims, 10 Drawing Sheets

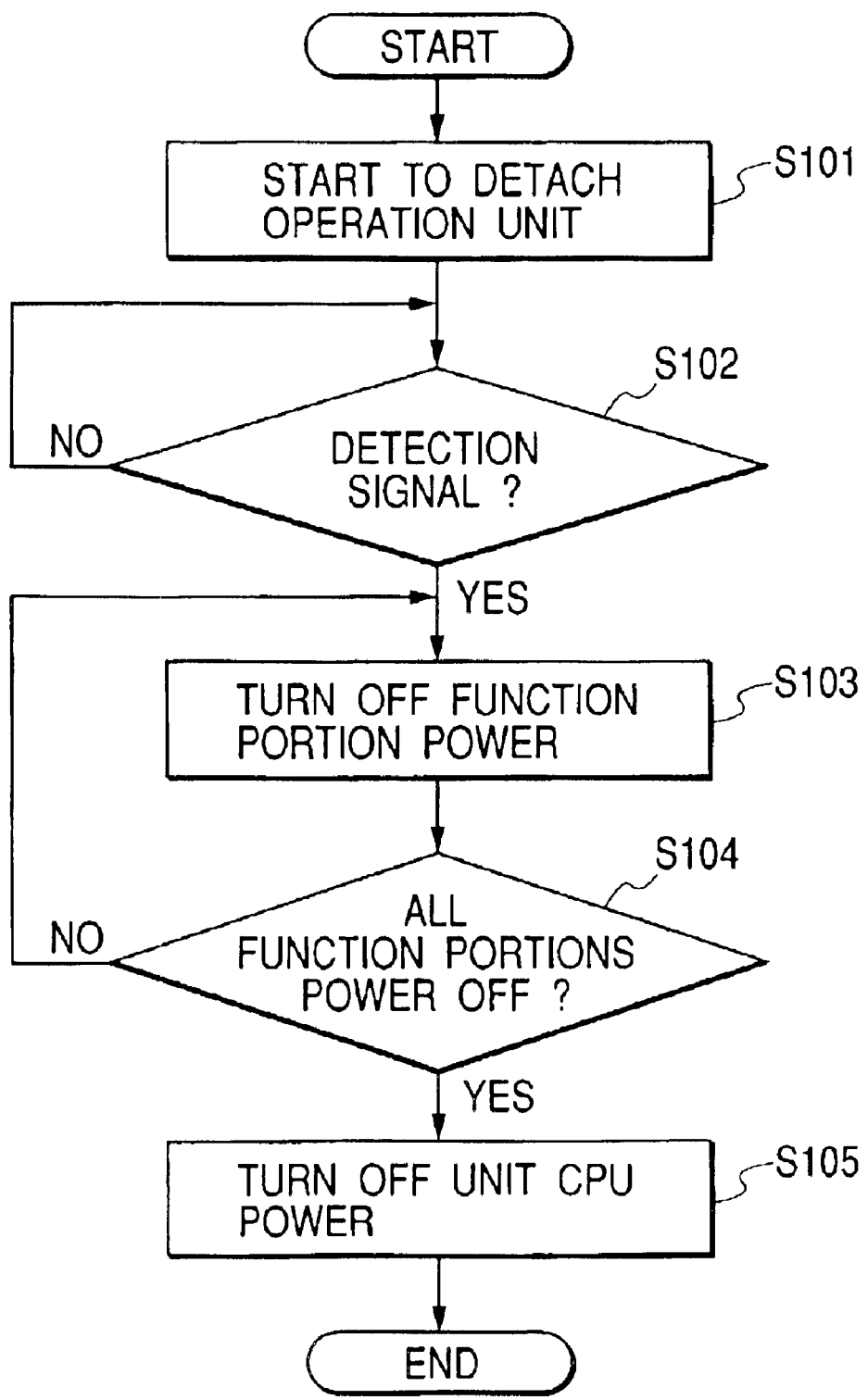

CONNECTOR, ELECTRONIC EQUIPMENT AND CONTROL METHOD FOR ELECTRONIC EQUIPMENT

The present disclosure relates to the subject matter contained in Japanese Patent Application No. 2001-382694 filed Dec. 17, 2001, which is incorporated herein by reference in its entirety.

BACKGROUND OF THE INVENTION

1. Field of the Invention

The present invention relates to an electronic equipment having a detachable operation unit, and more particularly to a connector for making an electrical connection between connecting portions, an electronic equipment using the connector, and a control method for the electronic equipment.

2. Description of the Related Art

Conventionally, various car audio apparatus such as a CD (Compact Disc) player, a DVD player, an MD (Mini Disc) player and an AM/FM tuner mounted in an instrument panel of a vehicle, and a car audio apparatus in which these are combined integrally or in which these are integrated with a navigation apparatus are used as electronic equipments. Also, there is a type having means for operating the electronic equipment by remote control.

In these car audio apparatus, operation functions tend to increase and the operation tends to become complicated, and many operation functions need be attached on an instrument panel, the area of which is limited. As a measure to this, various proposals have been made. For example, a system in which a plurality of operation units having operation keys are provided oppositely backward and forward in the front of a car audio apparatus and operation functions or display functions are distributed and provided to the respective operation units has been proposed. Further, a system for performing operation by remote control in addition to such an apparatus has been proposed.

Also, a system in which an operation unit can be detached from the car audio apparatus and carried around for preventing theft when the car is parked in a parking lot for a long time has been proposed.

When detaching the operation unit from the car audio apparatus, it is also required to disconnect the electrical connection. Normally, disconnection of terminals is conducted with some temporal differences. When the terminal for detecting detachment of the operation unit is disconnected with a delay from other terminals, the power to the CPU controlling the operation unit may be turned off before the power to other function portions such as display is turned off. Such the temporal differences cause a false display momentarily or an error in the initial settings. Hence, various measures have been required to prevent such failures.

SUMMARY OF THE INVENTION

An object of the present invention is to provide a connector for making the electrical connection between an electronic equipment main body and an operation unit, an electronic equipment using the connector, and an electronic equipment control method. Upon disconnecting the operation unit from the electronic equipment main body, the power to a CPU controlling the operation unit is turned off after the power to other function portions is turned off by the connector.

According to an aspect of the present invention, there is provided a connector for making electrical connection, comprising: a first member having a plurality of terminals made of a conductive material; and a second member having a plurality of electrodes that are provided at positions corresponding to the terminals and come into contact with the terminals, wherein the electrodes include at least one separation detecting electrode that is formed smaller than other electrodes, upon separation of the first member and the second member, the terminal being in contact with the separation detecting electrode is separated from the separation detecting electrode prior to separation of other terminals from corresponding electrodes.

The connector of this invention comprises the first member with the terminals and the second member with the electrodes that are opposed and aligned, so that the terminals and the electrodes are contacted to make the electrical connection. The electrodes may extend lengthwise, and at least one of the plurality of electrodes may be formed shorter in the longitudinal direction than other electrodes. When the first member and the second member are separated, the contact of the terminal with a shorter electrode is firstly released. The electronic equipment is controlled on the basis of a signal generated when disconnection firstly occurs at this terminal.

According to a connector of another aspect of this invention, at least one of the first and second members comprises a separating mechanism for sliding the first member in a direction along a longitudinal direction of the electrodes and separating the first member and the second member.

In this connector, the first member is separated from the second member by sliding along the longitudinal direction of electrodes. Since the connector itself regulates the separating direction, there is no need of providing means for regulating the separating direction on an apparatus that uses the connector.

In a connector according to another aspect of the invention, a sliding direction of the first member with respect to the second member is one in which the terminal being in contact with the separation detecting electrode is separated from the separation detecting electrode prior to separation of the other terminals from the corresponding electrodes.

In this connector, the separation of the terminal from the shorter electrode occurs earlier than other electrodes. Thus, it becomes possible to detect detachment of the connector before other connections are disengaged.

In a connector according to still another aspect, the terminals are urged by an elastic member in a direction of making contact with the electrodes.

In this connector, the contact between the terminals and the electrodes is made with a strong force to ensure the electrical conductivity at the contact portion reliably.

The connector may comprise the terminals provided in the first member and the electrodes provided in the second member that are arranged in one row extending in a direction orthogonal to the sliding direction of the first member.

In this connector, the connector has the terminals and electrodes arranged in one row in the direction at right angles to the sliding direction. At least one of the electrodes is the separation detecting electrode formed shorter in the longitudinal direction.

The connector may comprise the terminals provided in the first member and the electrodes provided in the second member that are arranged in a staggered manner along a direction orthogonal to the sliding direction of the first member.

In this connector, the connector has the terminals and electrodes arranged in a staggered manner along the direction at right angles to the sliding direction. Accordingly, it is possible to secure a large space for forming the terminals, whereby the connecting portions at high density can be formed. At least one of the electrodes is the separation detecting electrode formed shorter in the longitudinal direction.

Also, the present invention provides an electronic equipment comprising: an electronic equipment main body; an operation unit detachable from the electronic equipment main body; and the connector described above, wherein the electronic equipment main body comprises: a detection signal generating section for generating a separation detection signal to be supplied to the separation detecting electrode; and a power generating section for generating a power supplied to the operation unit, wherein the operation unit comprises: a control section for controlling the operation of each function portion in the operation unit; a separation detecting section for detecting the separation detection signal from the terminal being in contact with the separation detecting electrode; and a power cut-off section for cutting off a power supplied to each function portion of the operation unit and cutting off a power supplied to the control section on the basis of a detection signal from the separation detecting section.

The electronic equipment of the invention has the electronic equipment main body and the operation unit that are connected using the connector according to the invention. With the function of the separation detecting electrode provided for this connector, it is detected whether or not the electronic equipment main body and the operation unit are separated. In separating the electronic equipment main body and the operation unit, the separation detecting electrode of the connecter is used to control the power supplied to each function portion of the operation unit. The electronic equipment main body comprises means for generating a separation detection signal, and means for generating a power supplied to the operation unit, and the operation unit comprises means for controlling each function portion in the operation unit, means for detecting the separation between the electronic equipment main body and the terminal, and means for cutting off the power supply to each function portion of the operation unit, upon detecting a separation, whereby the power control at the time of separation is made appropriately.

The electronic equipment may include a display part and an illuminating part for illuminating the display part as function portions.

The display part displays the operating state and the explanation of each function for the electronic equipment. Also, the illuminating part is employed for illumination as a backlight because the liquid crystal display does not emit light by itself.

In an electronic equipment according to another aspect of the invention, the control section cuts off the power supplied to each function portion and then cuts off the power supplied to the control section when separation between the electronic equipment main body and the operation unit is detected by the separation detecting section.

In this electronic equipment, when the electronic equipment main body and the operation unit are separated, the power to the function portions for the operation unit is firstly cut off, and then the power to the control section is cut off. Accordingly, it is possible to make the initial settings of the function portions correctly to prevent a false display on the display part.

The electronic equipment according to the invention may comprise a mechanism for detaching the operation unit from the electronic equipment main body, wherein the mechanism is configured such that the operation unit is slid only in a direction in which the terminal being in contact with the separation detecting electrode is separated from the separation detecting electrode prior to separation of the other terminals from the corresponding electrodes.

In this electronic equipment, the mechanism for regulating the sliding direction which is structured by the operation unit and the electronic equipment main body allows the separation detecting electrode to be disconnected before other electrodes are separated from the terminals, even though the connector does not comprise the sliding direction guide. Hence, it is possible to detect that the operation unit is disconnected before the other terminals are separated from the electrodes.

The electronic equipment according to this invention may comprise the operation unit that is moved from the electronic equipment main body and placed at a predetermined position forward from a panel of the electronic equipment main body.

In this electronic equipment, since the operation unit is placed at a predetermined position forward from a panel of the electronic equipment main body, the user can operate the operation unit, and detach the operation unit from the electronic equipment main body more easily.

Also, this invention provides a control method for an electronic equipment having an electronic equipment main body and an operation unit detachable from the electronic equipment main body which are electrically connected by a connector according to claim 1, the control method comprising: generating a detection signal to be supplied to the separation detecting electrode; generating a power supplied to the operation unit; controlling operation of each function portion of the operation unit; detecting the separation detection signal from the terminal being in contact with the separation detecting electrode; and cutting off a power supplied to each function portion of the operation unit based on a detection signal that indicates a detection of the separation detection signal.

The control method for an electronic equipment may further comprise cutting off a power supplied to a control section for controlling the operation of each function portion after cutting off the power supplied to each function portion upon detection of separation between the electronic equipment main body and the operation unit.

In this control method for an electronic equipment of the invention, the electronic equipment main body and the operation unit are connected using the connector according to the invention, and there is the function of separation detecting electrode for the connector to indicate the condition of whether or not the electronic equipment main body and the operation unit are separated. Moreover, when they are separated, the power to the function portions for the operation unit is firstly cut off, and then the power to the control means controlling the operation unit is cut off. Thereby, the power control at the time of separation can be appropriately made.

The electronic equipment as above described may include an audio reproducing apparatus for reproducing CD (Compact-Disc) or MD (Mini-disc), and a radio receiver, in which operation parts for operating the electronic equipment is provided on the operation unit movable from the front panel of the electronic equipment main body.

These and other features and advantages of the present invention will become more apparent from the following detailed description of preferred embodiments.

BRIEF DESCRIPTION OF THE DRAWINGS

FIG. 1A is a state where the connector is attached, and FIG. 1B is a state where the connector is about to be detached;

FIG. 3A is a state where the connector is attached, and FIG. 3B is a state where the connector is about to be detached;

FIG. 10 is a flowchart for the power control of the electronic equipment.

DETAILED DESCRIPTION OF THE PREFFERED EMBODIMENTS

Preferred embodiments of the present invention will be described below with reference to the accompanying drawings.

First embodiment

Figure 1A:
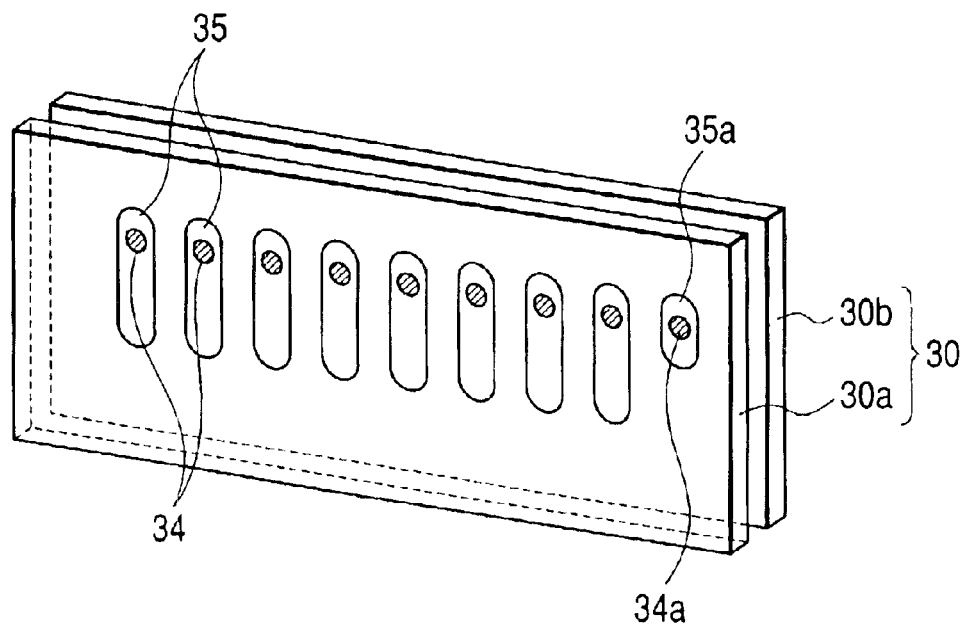
FIGS. 1A and 1B are perspective views showing an arrangement of electrodes and terminals of a connector according to the present invention.
Figure 1B:
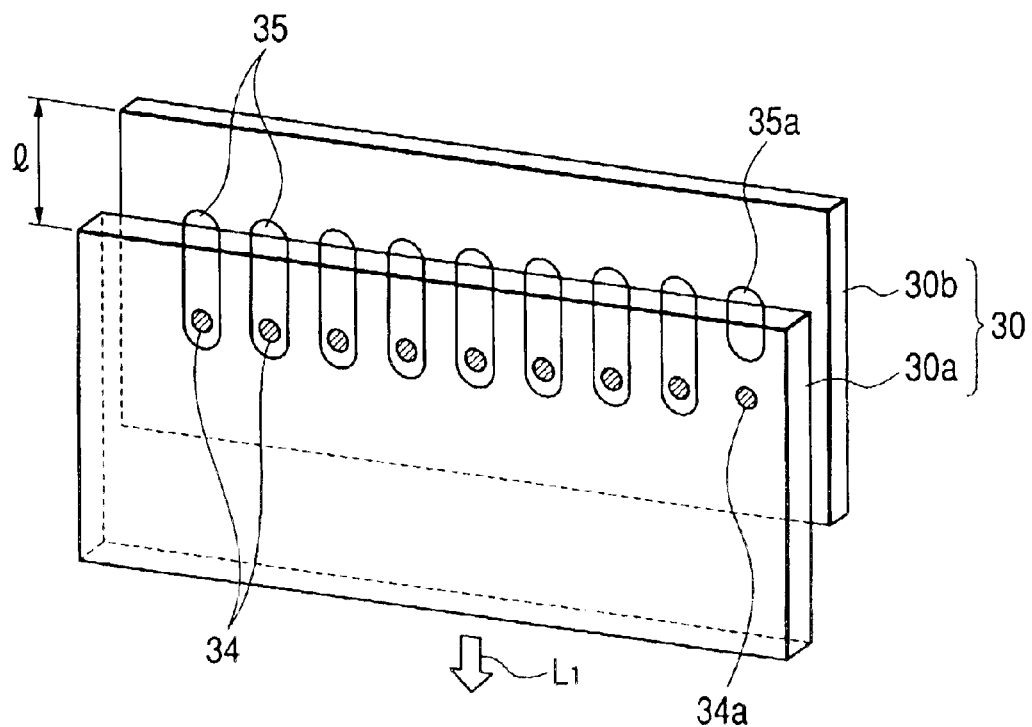
Figure 2:
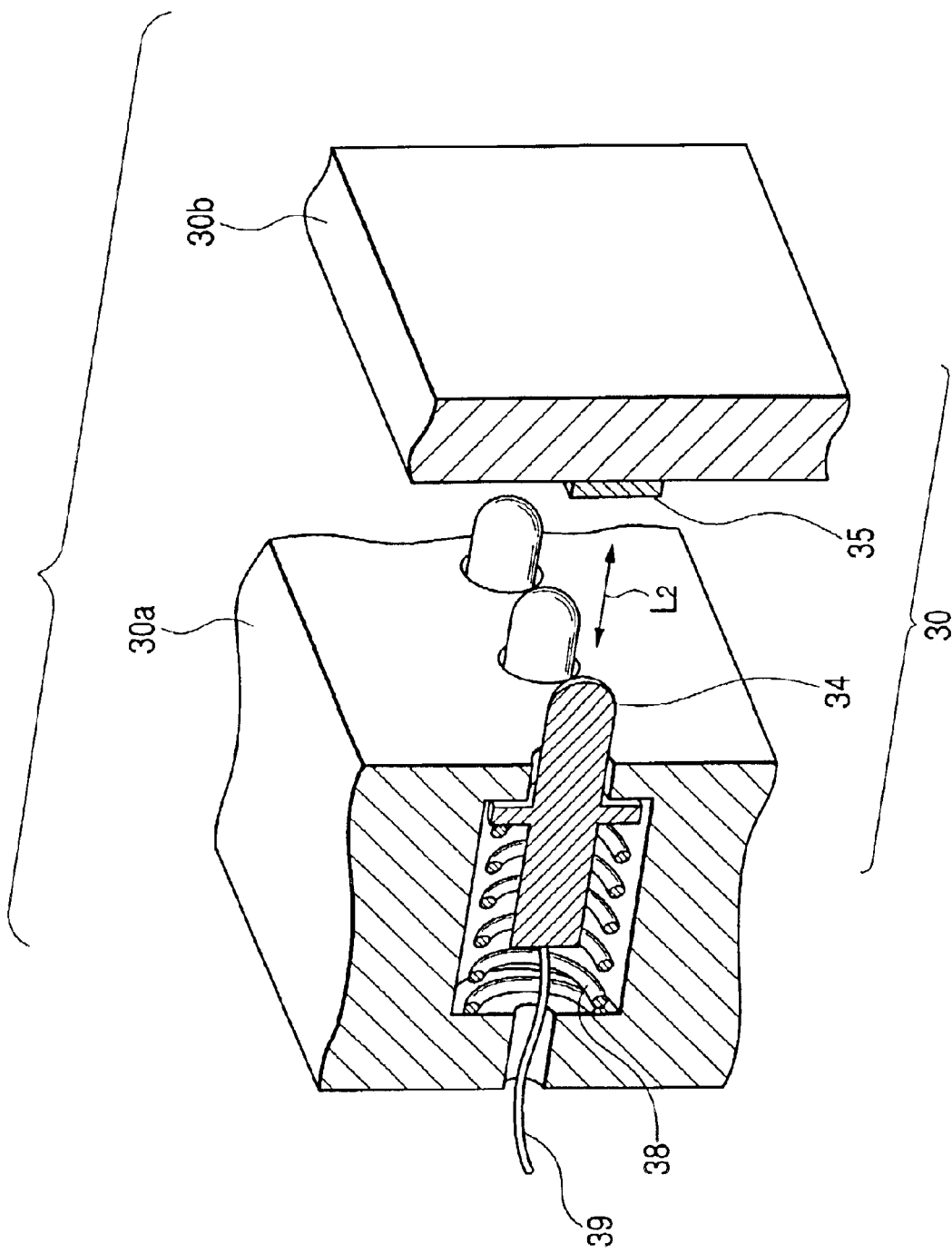
FIG. 2 is a partial cross-sectional view showing a configuration of the connector for use with an electronic equipment of the present invention.

Referring to FIGS. 1A, 1B and 2, a first embodiment of the present invention will be described below. FIGS. 1A and 1B are perspective views showing an arrangement of electrodes and terminals of a connector according to a first embodiment. FIG. 1A shows a state where the connector is attached, and FIG. 1B shows a state where the connector is about to be detached. FIG. 2 is a partial cross-sectional view showing a configuration of the connector according to the first embodiment.

The connector 30 is suitably used for an electronic equipment having an operation unit detachable from an electronic equipment main body. The connector 30, for example, have a function of detecting detachment of the operation unit in order to cut off the power supplied to function portions such as a display unit provided in the operation unit before the power supplied to a CPU controlling the function portions is cut off, when the operation unit is detached from the electronic equipment main body, as will be described later in detail.

As shown in FIG. 1, the connector 30 comprises an operation unit connector 30a that is fixed on the operation unit, and an electronic equipment main body connector 30b that is fixed on the electronic equipment main body. The operation unit connector 30a is provided with a plurality of terminals 34 made of a conductive material at regular intervals aligned in a row. On the other hand, the electronic equipment main body connector 30b that is fixed on the electronic equipment main body is provided with a plurality of electrodes 35 at the positions corresponding to the terminals 34 at regular intervals. Accordingly, if the operation unit connector 30a and the electronic equipment main body connector 30b are put together, each terminal 34 and each electrode 35 are brought into contact to make electrical connection between the operation unit and the electronic equipment main body.

At least one of the electrodes 35 is formed to be shorter than other electrodes 35 and serves as a detecting electrode, as denoted by reference numeral 35a. The detecting electrode 35a is disposed at the same upper position as the electrodes 35, and shorter on the lower side. This point is a feature of the connector of this invention.

FIG. 1A is a state where the connector is attached, while FIG. 1B is a state where the connector is detached, in which the operation unit connector 30a is separated by sliding it in a direction of the arrow L1. FIG. 1B is a state where the operation unit connector 30a is moved a distance "l" in a direction of the arrow L1 with respect to the electronic equipment main body connector 30b, in which the terminals 34 and the electrodes 35 are still in contact state, but the detecting terminal 34a and the detecting electrode 35a are off and disconnected earlier than other connections.

As shown in FIG. 2, the terminals 34 are urged toward the electrodes 35 by a spring 38, and movable in a direction of the arrow L2. Accordingly, when the operation unit connector 30a is in close contact with the electronic equipment main body connector 30b, the terminals 34 abut against the electrodes 35 to ensure the electrical connection. A signal through the terminals 34 to the function portions of the operation unit is passed via a lead wire 39. The mechanism for the terminals 34 is not limited to the above structure, but other mechanisms for urging the terminals 34 toward the electrodes 35 such as a leaf spring may be employed.

The sliding and separating mechanism may be a well-known structure such as a combination of grooves and projections. This mechanism may be provided on the connector 30, or on the operation unit and the electronic equipment main body.

Second Embodiment

Figure 3A:
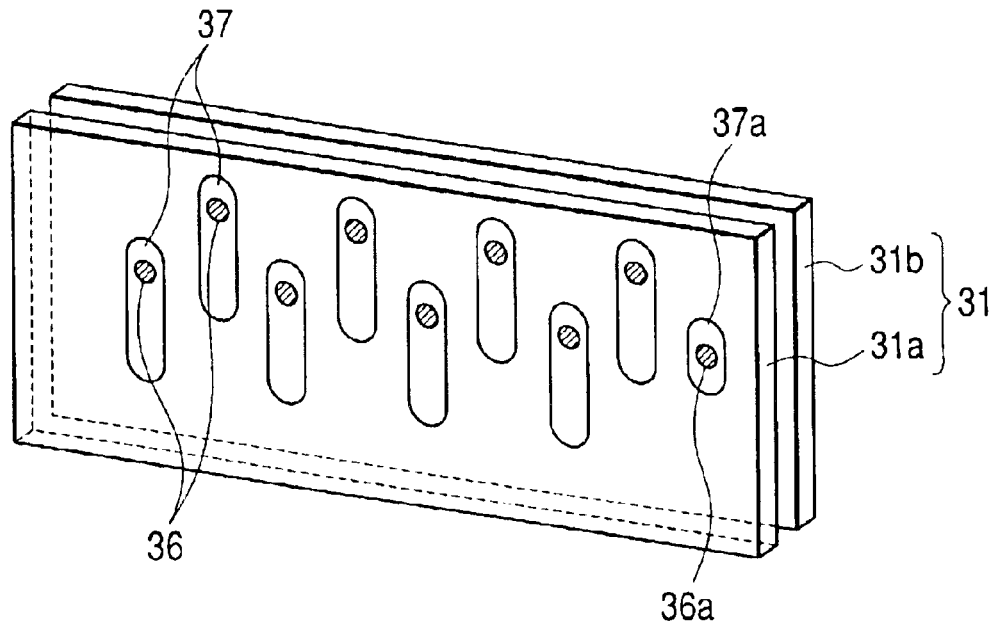
FIGS. 3A and 3B are perspective views showing another arrangement of electrodes and terminals of an connector of the present invention.
Figure 3B:
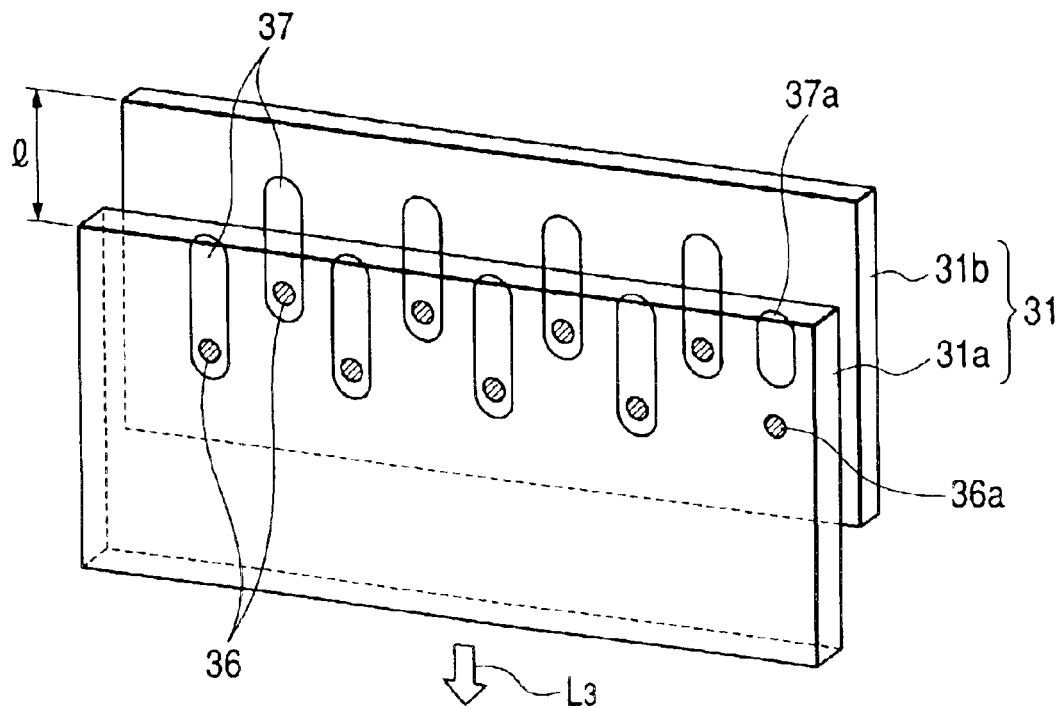

Referring to FIGS. 3A and 3B, a second embodiment of the invention will be described below. FIGS. 3A and 3B are perspective views showing another arrangement of electrodes and terminals of a connector according to the second embodiment. FIG. 3A is a state where the connector is attached, and FIG. 3B is a state where the connector is about to be detached.

As shown in FIG. 3, the connector 31 comprises an operation unit connector 31a that is fixed on an operation unit, and an electronic equipment main body connector 31b that is fixed on an electronic equipment main body. The operation unit connector 31a is provided with a plurality of terminals 36 made of a conductive material at regular intervals in a staggered arrangement. On the other hand, the electronic equipment main body connector 31b that is fixed on the electronic equipment main body is provided with a plurality of electrodes 37 at the positions corresponding to the terminals 36. Accordingly, if the operation unit connector 31a and the electronic equipment main body connector 31*b* are put together, each terminal 36 and each electrode 37 are brought into contact to make electrical connection between the operation unit and the electronic equipment main body.

At least one of the electrodes 37 is formed to be shorter than other electrodes 37 and serves as a detecting electrode, as denoted by reference numeral 37*a*. The detecting electrode 37*a* is disposed at the same upper position as the electrodes 37 in the same row, and shorter on the lower side.

FIG. 3A is a state where the connector is attached, while FIG. 3B is a state where the connector is detached, in which the operation unit connector 31*a* is separated by sliding it in a direction of the arrow L3. FIG. 3B is a state where the operation unit connector 31*a* is moved a distance "l" in the direction of the arrow L3 with respect to the electronic equipment main body connector 31*b*, in which the terminals 36 and the electrodes 37 are still in contact state, but the detecting terminal 36*a* and the detecting electrode 37*a* are off and disconnected earlier than other connections. Accordingly, it is possible to detect the disconnection before other connections are separated.

The constitution and function of the terminals 36 are the same as those described in connection with FIG. 2, and the connector mechanism for regulating the direction along which the operation unit connector 31*a* and the electronic equipment main body connector 31*b* are detached is also the same as described in the first embodiment. The description of them is omitted here.

Third Embodiment

Referring to FIGS. 4 to 7, a third embodiment of the invention will be described below. In this embodiment, an electronic equipment comprises an electronic equipment main body and two operation units, in which an operation unit provided on the front portion is detachable from the electronic equipment main body. The electrical connection between the electronic equipment main body and the detachable operation unit is made using the connector as described in the first embodiment. However, the electrical connection may be made using the connector as described in the second embodiment.

Figure 4:
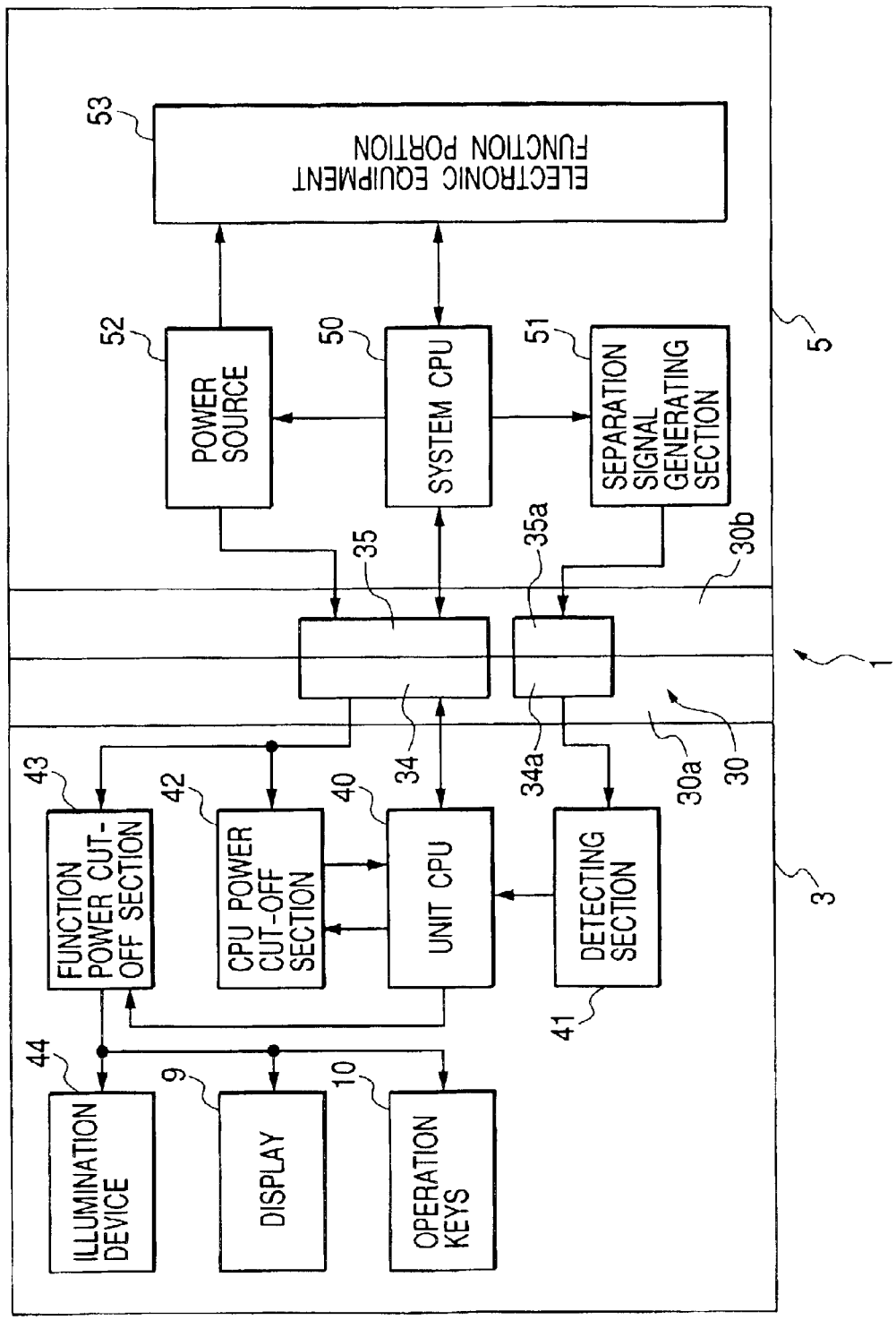
FIG. 4 is a block diagram showing a configuration of the electronic equipment.
Figure 5:
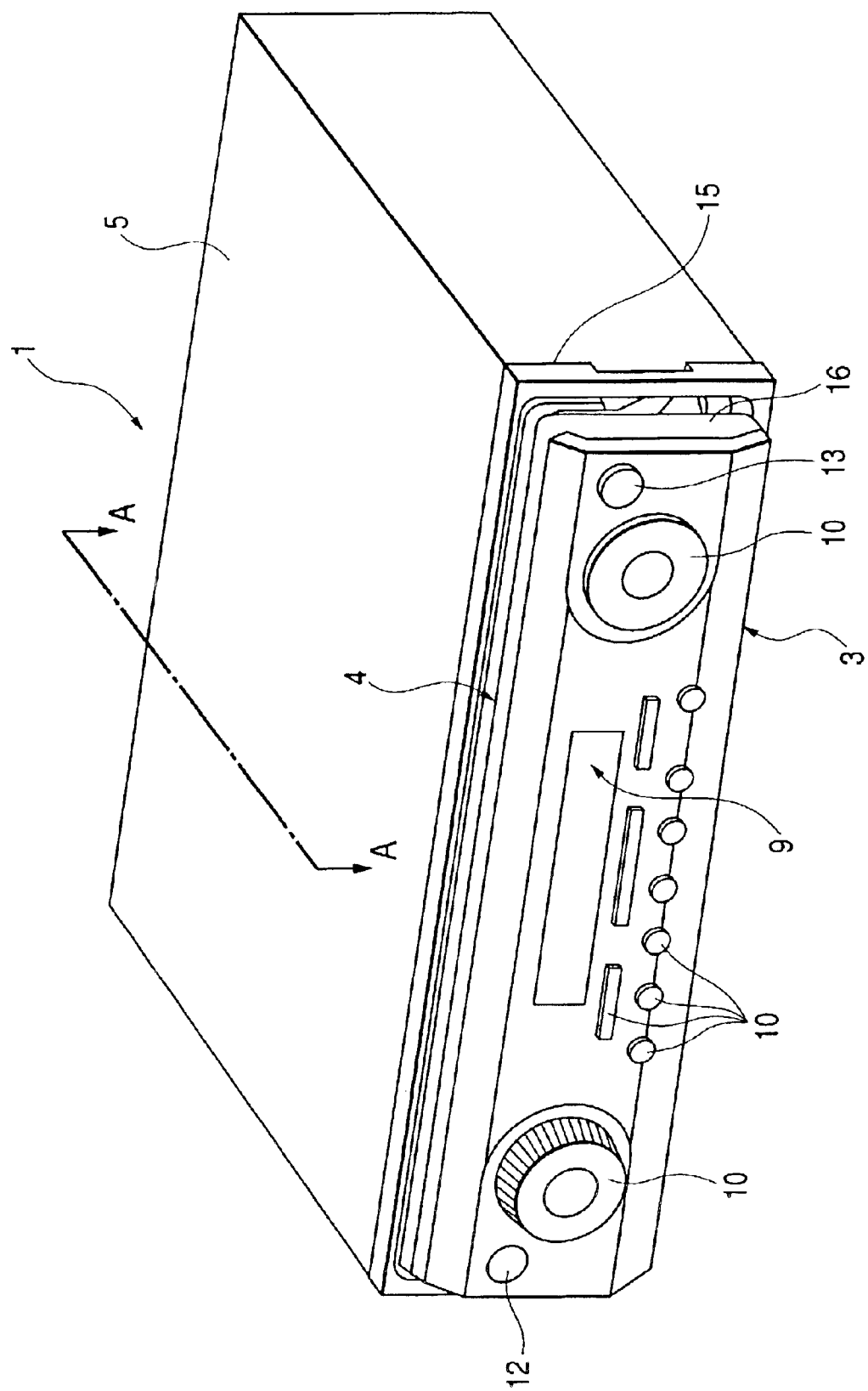
FIG. 5 is a perspective view showing the electronic equipment.
Figure 6:
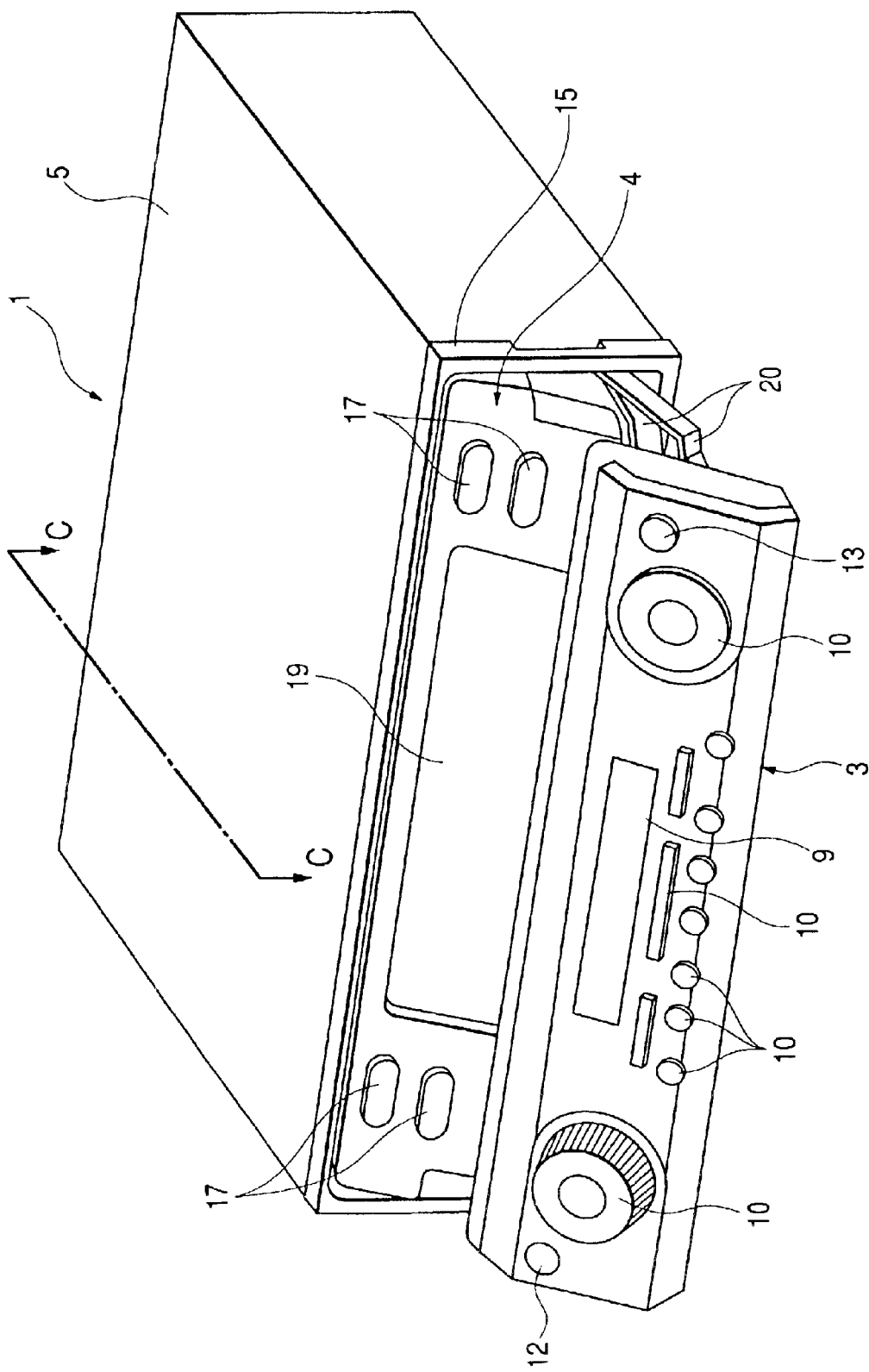
FIG. 6 is a perspective view showing the electronic equipment in an open state.
Figure 7:
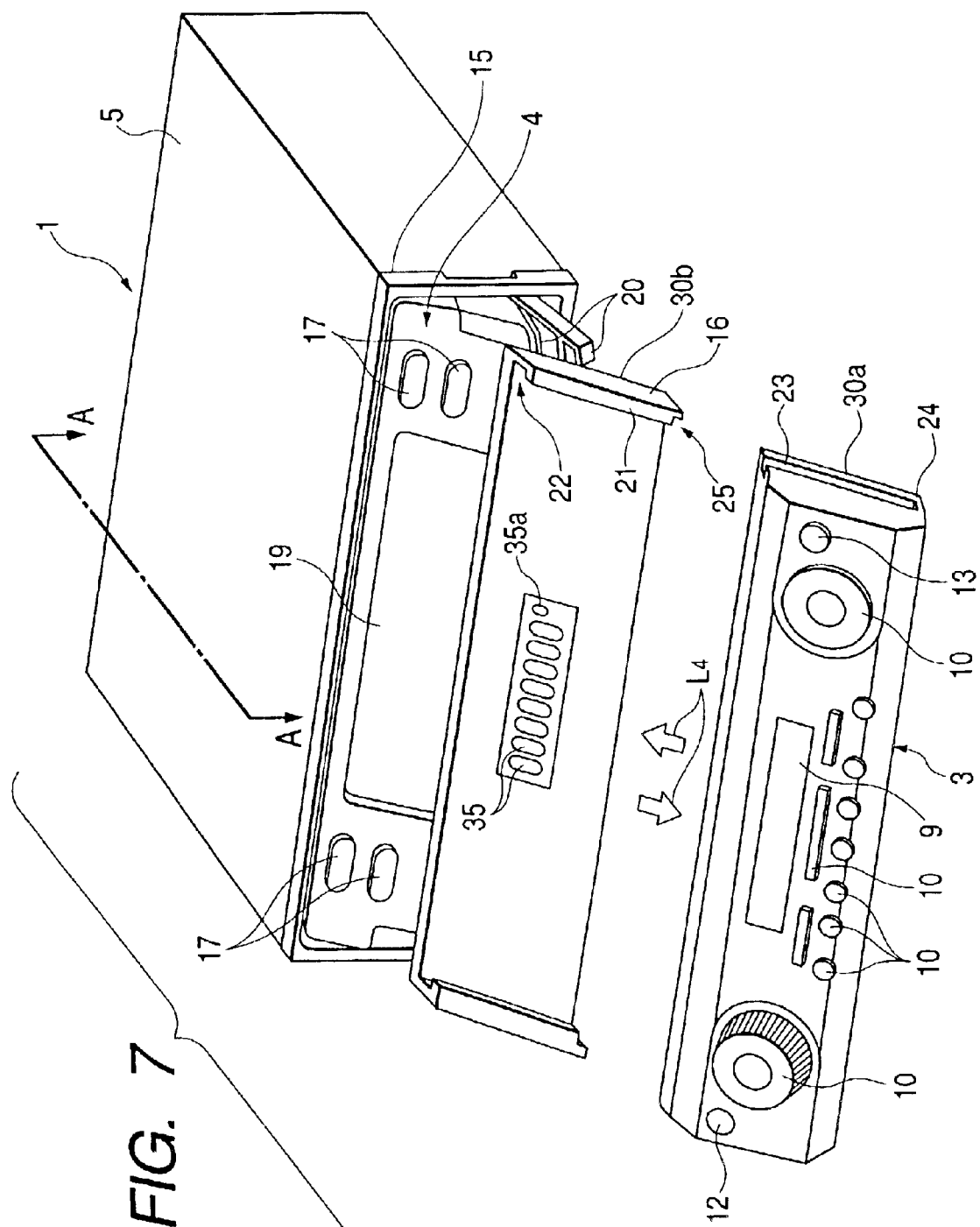
FIG. 7 is a perspective view showing the electronic equipment in a condition where the operation unit is detached.
Figure 8:
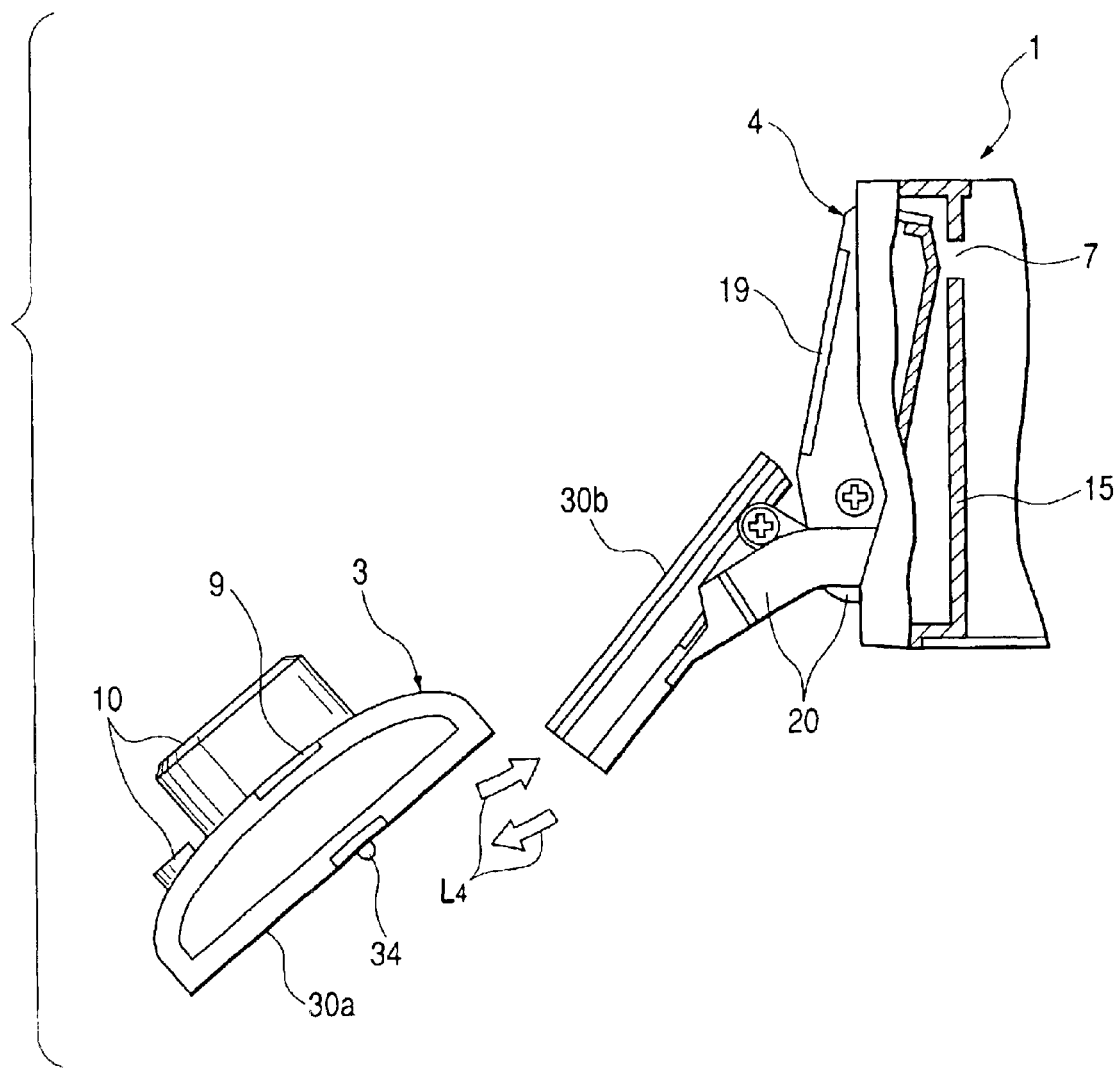
FIG. 8 is a partial cross-sectional side view of the electronic equipment taken along line A—A of FIG. 7.
Figure 9:
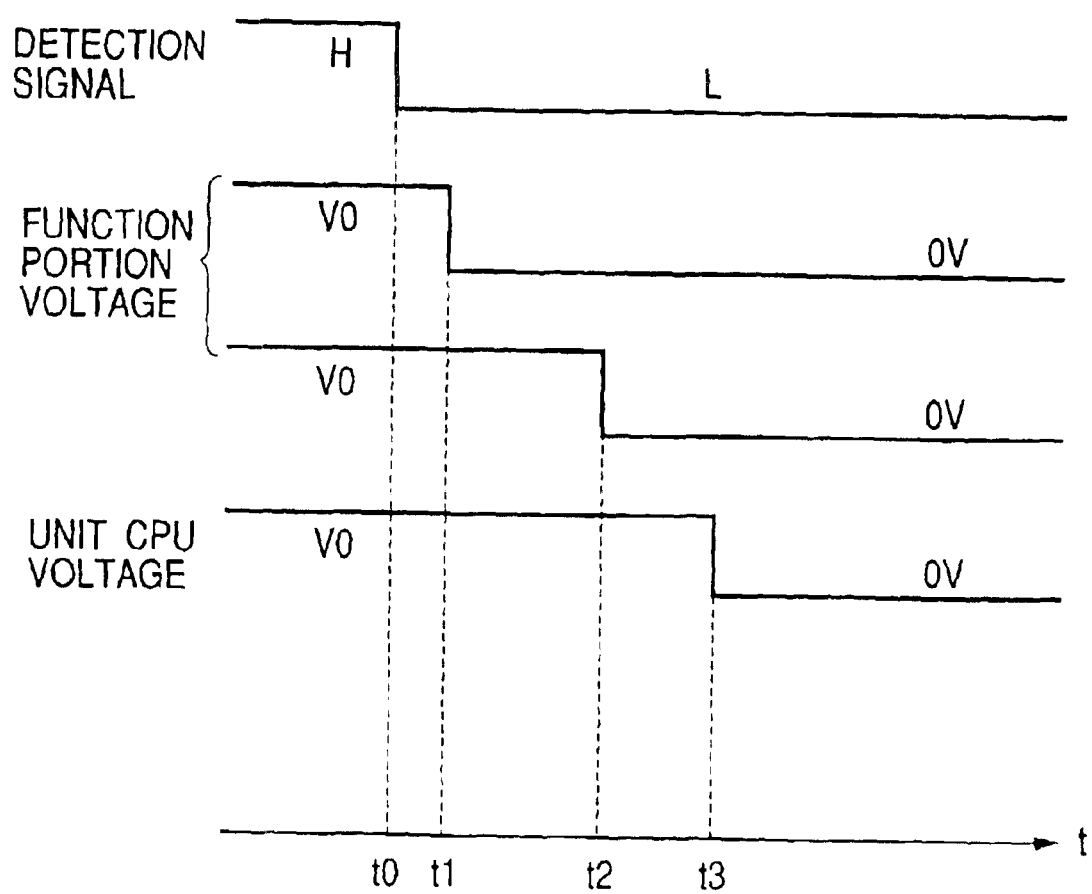
FIG. 9 is a timing chart for a power control of the electronic equipment.

FIG. 4 is a block diagram showing the configuration of the electronic equipment of the invention. FIG. 5 is a perspective view showing the electronic equipment. FIG. 6 is a perspective view showing the electronic equipment in an open state. FIG. 7 is a perspective view showing the electronic equipment in a state where the operation unit is detached. FIG. 8 is a partial cross-sectional side view showing the electronic equipment taken along line A—A of FIG. 7. FIG. 9 is a timing chart for a power control of the electronic equipment. FIG. 10 is a flowchart for the power control of the electronic equipment.

The electronic equipment comprises a first operation unit 3, the electronic equipment main body 5, and a connector 30 for making electrical connection between the first operation unit 3 and the electronic equipment main body 5, as shown in FIG. 4.

The connector 30 comprises an operation unit connector 30*a* that is mounted on the first operation unit 3, and an electronic equipment main body connector 30*b* that is mounted on the electronic equipment main body 5. The operation unit connector 30*a* is provided with terminals 34 for connecting the power and the electrical signal, and a detecting terminal 34*a* for detecting the separation of connection. On the other hand, the electronic equipment main body connector 30*b* is provided with electrodes 35 for connecting the power and the electrical signal, and a detecting electrode 35 for detecting the separation of connection.

The first operation unit 3 comprises a unit CPU 40 for controlling the operation unit, a detecting section 41 for detecting the detection signal from the detecting terminal 34*a*, a CPU power cut-off section 42 for cutting off the power to the unit CPU 40, a function power cutting section 43 for cutting off the power to function portions of the first operation unit 3, and a display 9, the operation keys 10 and an illuminating device 44 serving as various function portions.

The electronic equipment main body 5 comprises a system CPU 50 for controlling the entire electronic equipment, a separation signal generating section 51 for generating a signal for detecting the separation of connection, a power source section 52 for supplying an electric power to the first operation unit 3, and an electronic equipment function portion 53 for making the proper functions of the electronic equipment, such as a CD or MD reproducing mechanism.

FIG. 5 shows the electronic equipment 1 having the electronic equipment main body 5 and two operation units for operating the electronic equipment 1. The two operation units are disposed on a front panel 15 of the electronic equipment 1 opposing to each other back and forth. One operation unit disposed on the fore side is a first operation unit 3, and the other operation unit disposed on the back side is a second operation unit 4. The first operation unit 3 is held in a holder 16 of the electronic equipment main body 5 to secure the electrical connection.

The first operation unit 3 comprises, on the front face, the display 9, various operation keys 10, a light receiving part 12, and an open/close key 13. The second operation unit 4 comprises the operation keys 17 and a display 19, as shown in FIG. 6.

The display 9 of the first operation unit 3 displays the function of the electronic equipment 1 and the operating state. The operation keys 10 are input keys for operating the electronic equipment 1. The light receiving part 12 receives infrared rays from a remote control terminal. The open/close key 13 is an input key for automatically moving the first operation unit 3 to a predetermined position and making the second operation unit 4 visible upon operating this key.

The operation keys 17 of the second operation unit 4 are input keys for operating the electronic equipment 1. The display 10 has a function of displaying the detailed explanation, in addition to the functions and the operating state of the electronic equipment 1.

The display 9 as display means is preferably a liquid crystal display, and the display 19 is preferably an organic EL (Electro-Luminescence).

Since two operation units including the first operation unit 3 and the second operation unit 4 are provided, more operation keys 10, 17 can be arranged in a limited space of the instrument panel if the electronic equipment is mounted on a vehicle, and the display 19 can have a larger size and a higher resolution. If the second operation unit 4 is required to use, the first operation unit 3 is moved to the predetermined position and the second operation unit 4 is made visible to the user.

The electronic equipment 1 has various sorts of components for implementing its functions, for example, a CD or MD reproducing mechanism for the audio player, a tuner for receiving AM/FM broadcast radio wave for the radio receiver, demodulating means for demodulating the received radio wave into an audio signal, a television channel tuner for receiving a video radio wave, and demodulating means for demodulating the received radio wave into a video or audio signal. Also, the display 19 of the second display unit 4 may be utilized for the video display of DVD or television.

FIG. 6 is a state where the first operation unit 3 is opened to the predetermined position, and the second operation unit 4 is usable. As can be seen from FIG. 6, the first operation unit 3 is protruded forward and placed at a slightly upward angle to be more visible to the user. The second operation unit 4 is also placed at a slightly upward angle to be more visible to the user. The first operation unit 3 is operated in a predetermined way under the control via the arms 20 from a drive unit, not shown. The second operation unit 4 may be provided with the same mechanism for driving the first operation unit 3, when needed to be moved. For example, when a disk of the electronic equipment 1 is mounted behind the second operation unit 4, the second operation unit 4 may be moved.

FIG. 7 is a state where the first operation unit 3 is detached from the electronic equipment main body 5 in the state shown in FIG. 6. When the vehicle is stopped for a long time, the first operation unit is detached and the holder is restored to its original position (as indicated in FIG. 5) to cover the second operation unit 4, so that the electronic equipment 1 is prevented from being stolen. FIG. 8 is a side view, partially in cross-section, of the electronic equipment, taken along line A—A of FIG. 7. It will be apparent from FIG. 8 how to attach the first operation unit 3.

The first operation unit 3 is attached or detached in the direction of the arrow L4 from the holder 16 of the electronic equipment main body 5 as shown in FIG. 7, and in the same time the electronic equipment main body connector 30b provided on the electronic equipment main body 5 and the operation unit connector 30a provided on the face in the holder 16 of the first operation unit 3.

The first operation unit 3 is provided with a stopper 24 for regulating the direction of detaching so that the separation between the detecting terminal 34a and the detecting electrode 35a occurs before the separation between other terminals 34 and electrodes 35. This stopper 24 abuts against a notch 25 provided on the holder 16 to stop the first operation unit 3.

The first operation unit 3 is attached in the holder 16 in such a manner that a groove portion 23 formed in the first operation unit 3 is aligned and engaged with a convex portion 21 formed in the holder 16 and the first operation unit 3 is slid with respect to the holder 16. The attaching method and mechanism are not limited to the above way, but any mechanism may be employed as long as the separation between the detecting terminal 34a and the detecting electrode 35a firstly occurs.

As described above, according to the connector and the electronic equipment using the connector for making electrical connection between the operation unit and the electronic equipment main body, in which an electric power or an electrical signal is passed from the electronic equipment main body via the connector to the operation unit, it is possible to detect early that the operation unit is detached from the electronic equipment main body. Based on this detection, the initial settings for various functions of the operation unit are performed, or the power to the function portions is cut off. Then, the CPU controlling the operation unit is powered off. Thus, it is possible to prevent the malfunction of the operation unit.

Referring to FIG. 9, a control method of the electronic equipment 1 according to the invention will be described below.

First of all, if the detecting terminal 34a and the detecting electrode 35a are separated at time $t_0$, a detection signal is issued from the detecting section 41 at that time. In FIG. 9, the signal level is turned from "H" to "L". The separation signal generating section 51 of the electronic equipment main body 5 supplies a voltage at "H" level to the detecting electrode 35a, the detecting terminal 34a being grounded via a resistor, whereby a signal from "H" to "L" can be easily obtained, when the detecting electrode 35a is disconnected from the detecting terminal 34a.

To prevent the malfunction due to noise, the separation signal generating section 51 may generate a modulated signal in a certain format, and supply it to the detecting electrode 35a. The detecting section 41 demodulate the signal, and checks the signal to detect the separation between the detecting terminal 34a and the detecting electrode 35a, namely, between the first operation unit 3 and the holder 16 (i.e., electronic equipment main body 5).

The power to the function portions such as the display 9, the operation keys 10 and the illuminating unit 44 for the first operation unit 3 is turned off successively from time $t_1$, to time $t_2$. That is, the power voltage is changed from $V_0$ volts to zero volt.

Then, at time t3 when the power to all the function portions is turned off, the power to the unit CPU 40 controlling the functions of the first operation unit 3 is turned off. Besides the above method in which the power to the unit CPU 40 is turned off by itself, the power to the function portions may be turned off under the control of the unit CPU 40 before the terminals 34 supplying electric power are separated from the electrodes 35, and the power to the unit CPU 40 itself may be automatically turned off when the terminals 34 supplying electric power are fully separated from the electrodes 35.

When the first operation unit 3 is detached from the holder 16 under the above control, the power to the function portions for the first operation unit 3 is firstly turned off, and then the power to the unit CPU 40 is turned off, whereby it is possible to prevent the malfunction on the initial settings and the display.

Referring to a flowchart of FIG. 10, a control flow of the electronic equipment 1 of the invention will be described below.

First of all, the first operation unit 3 starts to be detached from the holder 16 (step S101). Then, it is determined whether or not the detecting terminal 34a and the detecting electrode 35a are separated, based on a detection signal detected by the detecting section 41 (step S102). If not separated, the operation waits till the separation is detected. If it is determined that they are separated, the power to the function portions such as the display 9 for the first operation unit 3 is turned off upon an instruction of the unit CPU 40 (step S103). It is determined whether or not the power to all the function portions is turned off (step S104). The check is repeated till the power to all the function portions is turned off. After the power to all the function portions is turned off, the unit CPU 40 itself is powered off.

The above operation is performed under the control of the unit CPU 40. When the first operation unit 3 is detached from the holder 16, the power to the function portions for the first operation unit 3 is firstly turned off, and the unit CPU 40 is powered off, whereby it is possible to prevent the malfunction in the initial settings and the display. In the third embodiment, the first operation unit 3 is provided with the CPU power cut-off section 42 and the function power cut-off section 43, in which the function power to the first operation unit 3 is turned off, upon an instruction from the unit CPU 40, and then the unit CPU 40 is powered off. Alternatively, the electronic equipment main body 5 may be provided with the CPU power cut-off section 42 and the function power cut-off section 43, in which the function power to the first unit 3 and the power to the unit CPU 40 may be turned off, upon an instruction from the system CPU 50. In this case, the system CPU 50 receives a signal indicating the separation from the unit CPU 40, then the power supply to the terminals 35 corresponding to the function portions of the first operation unit 3 is cut off, and then the power supply to the unit CPU is cut off.

The above system is not limited to the electronic equipments dealing with the audio, but may be employed for the electronic equipments dealing with the video. Also, it may be applied to the electronic equipments for home use, in addition to the apparatuses mounted on a vehicle.

This invention is not limited to the above embodiments, and various changes and modifications may be appropriately made without departing from the spirit and scope of the present invention. The modified connector, the electronic equipment and the control method of electronic equipment are also included within the scope of the present invention.

As described above, with the connector, the electronic equipment and the electronic equipment control method according to the invention, when the operation unit is detached from the electronic equipment main body, the power to the function portions such as display and illumination for the operation unit is firstly cut off, and then the power to the CPU controlling the operation unit is cut off, whereby it is possible to prevent a false display or other problems from occurring. Also, it is possible to shorten the time taken to make the fine adjustment of mask time for microcomputer software, or hardware measures such as pull up/down, thereby enabling cost down.

What is claimed is:

1. A connector for making electrical connection, comprising:
    a first member having a plurality of terminals made of a conductive material;
    a second member having a plurality of electrodes that are provided at positions corresponding to the terminals and come into contact with the terminals,
    wherein the electrodes include at least one separation detecting electrode that is formed smaller than other electrodes, and
    wherein, upon separation of the first member and the second member, the terminal corresponding to the separation detecting electrode is separated from the separation detecting electrode prior to separation of other terminals from corresponding electrodes; and
    a signal generation circuit that generates a modulated signal having a predetermined format,
    wherein the modulated signal flows through the separation detecting electrode and the terminal corresponding to the separation detecting electrode only when the separation detecting electrode and the terminal corresponding to the separation detecting electrode are in contact.

2. The connector according to claim 1, wherein at least one of the first and second members comprises a separating mechanism for sliding the first member in a direction along a longitudinal direction of the electrodes and separating the first member and the second member.

3. The connector according to claim 2, wherein a sliding direction of the first member with respect to the second member is one in which the terminal being in contact with the separation detecting electrode is separated from the separation detecting electrode prior to separation of the other terminals from the corresponding electrodes.

4. The connector according to claim 1, wherein the terminals are urged by an elastic member in a direction of making contact with the electrodes.

5. The connector according to claim 2, wherein the terminals and the electrodes are arranged in a row extending in a direction that is orthogonal to a sliding direction of the first member.

6. The connector according to claim 2, wherein the terminals and the electrodes are arranged in a staggered manner along a direction that is orthogonal to a sliding direction of the first member.

7. The connector according to claim 1, further comprising:
    a detecting circuit that detects whether or not the separation detecting electrode and the terminal corresponding to the separation detecting electrode are in contact based on the modulated signal.

8. The connector according to claim 7, wherein the terminal corresponding to the separation detection electrode is located between the separation detecting electrode and the detecting circuit, and
    wherein the separation detecting electrode is located between the terminal corresponding to the separation detecting electrode and the signal generation circuit.

9. An electronic equipment comprising:
    an electronic equipment main body;
    an operation unit detachable from the electronic equipment main body; and
    a connector according to claim 1,
    wherein the electronic equipment main body comprises:
    a power generating section for generating a power supplied to the operation unit, wherein the operation unit comprises:
    a control section for controlling the operation of each function portion in the operation unit;
    a separation detecting section that detects whether or not the terminal corresponding to the separation detecting electrode is in contact with the separation detecting electrode based on the modulated signal; and
    a power cut-off section for cutting off a power supplied to each function portion of the operation unit and cutting off a power supplied to the control section on the basis of a detection signal from the separation detecting section.

10. The electronic equipment according to claim 9, wherein the function portion includes a display part and an illuminating part for illuminating the display part.

11. The electronic equipment according to claim 9, wherein the control section cuts off the power supplied to each function portion and then cuts off the power supplied to the control section when separation between the electronic equipment main body and the operation unit is detected by the separation detecting section.

12. The electronic equipment according to claim 9, further comprising a mechanism for detaching the operation unit from the electronic equipment main body,
    wherein the mechanism is configured such that the operation unit is slid only in a direction in which the terminal being in contact with the separation detecting electrode is separated from the separation detecting electrode prior to separation of the other terminals from the corresponding electrodes.

13. The electronic equipment according to claim 9, wherein the operation unit is moved from the electronic equipment main body and placed at a predetermined position forward from a panel of the electronic equipment main body.

14. The connector according to claim 9, wherein the terminal corresponding to the separation detection electrode is located between the separation detecting electrode and the separation detecting circuit, and wherein the separation detecting electrode is located between the terminal corresponding to the separation detecting electrode and the signal generation circuit.

15. A control method for an electronic equipment having an electronic equipment main body and an operation unit detachable from the electronic equipment main body which are electrically connected by a connector according to claim 1, the control method comprising:

generating a detection signal to be supplied to the separation detecting electrode;

generating a power supplied to the operation unit;

controlling operation of each function portion of the operation unit;

detecting the separation detection signal from the terminal being in contact with the separation detecting electrode, wherein the separation detection signal comprises a modulated signal having a predetermined format; and cutting off a power supplied to each function portion of the operation unit based on a detection signal that indicates a detection of the separation detection signal.

16. The control method for an electronic equipment according to claim 15, further comprising:

cutting off a power supplied to a control section for controlling the operation of each function portion after cutting off the power supplied to each function portion upon detection of separation between the electronic equipment main body and the operation unit.

* * * * *